United States Patent [19]

Hüppi

[11] Patent Number: 5,151,766
[45] Date of Patent: Sep. 29, 1992

[54] SEMICONDUCTOR COMPONENT

[75] Inventor: Marcel Hüppi, Zürich, Switzerland

[73] Assignee: Asea Brown Boveri Ltd., Baden, Switzerland

[21] Appl. No.: 713,018

[22] Filed: Jun. 11, 1991

Related U.S. Application Data

[63] Continuation of Ser. No. 520,813, May 9, 1990, abandoned.

[30] Foreign Application Priority Data

May 18, 1989 [CH] Switzerland .................. 1861/89

[51] Int. Cl.⁵ .............................. H01L 29/74
[52] U.S. Cl. .................. 357/38; 357/13; 357/23.4; 357/34
[58] Field of Search ............. 357/23.4, 91, 38, 13, 357/34; 437/24

[56]  References Cited

U.S. PATENT DOCUMENTS

| | | | |
|---|---|---|---|
| 3,888,701 | 6/1975 | Tarneja et al. | 357/91 |
| 3,933,527 | 1/1976 | Tarneja et al. | 357/91 |
| 4,056,408 | 11/1977 | Bartko et al. | 357/91 |
| 4,115,798 | 9/1978 | Platzoeder | 357/38 |
| 4,240,844 | 12/1980 | Felice et al. | 357/91 |
| 4,249,962 | 2/1981 | Celler | 357/91 |
| 4,278,475 | 7/1981 | Bartko et al. | 357/91 |
| 4,406,709 | 9/1983 | Celler | 357/91 |
| 4,987,087 | 1/1991 | Voss | 437/24 |

FOREIGN PATENT DOCUMENTS

| | | | |
|---|---|---|---|
| 53-084691 | 7/1978 | Japan | 437/24 |
| 55-038058 | 3/1980 | Japan | 357/7 |
| 56-105641 | 8/1981 | Japan | 437/24 |
| 1-009658 | 1/1989 | Japan | 357/23.4 |
| 1-019771 | 1/1989 | Japan | 357/23.4 |
| 1-162368 | 6/1989 | Japan | 357/23.4 |
| 2081009 | 2/1982 | United Kingdom | 437/24 |

Primary Examiner—Andrew J. James
Assistant Examiner—Sara W. Crane
Attorney, Agent, or Firm—Oblon, Spivak, McClelland, Maier & Neustadt

[57]  ABSTRACT

In order to improve overall the trade-off between forward voltage drop and turn-off time, in a doped zone an axially limited region is provided with recombination centers. The recombination centers form a trap density profile varying periodically in one or two dimensions transverse to the axial direction. The period corresponds approximately to the bulk diffusion length of the minority charge carriers in the doped zone. Preferably, the change in the trap density profile from segments of low trap density to segments of high trap density takes place abruptly. The sections of low trap density and those of high trap density are approximately of the same size in terms of area.

5 Claims, 2 Drawing Sheets

SEMICONDUCTOR COMPONENT

This application is a continuation of application Ser. No. 07/520,813, filed on May, 9, 1990, now abandoned.

BACKGROUND OF THE INVENTION

1. Field of the Invention

The invention relates to a semiconductor component that can switch from a conducting into a non-conducting state, comprising a doped zone having minority charge carriers, which in the non-conducting state have a given mean bulk lifetime $Tau_{SRH}$ and thus a mean bulk diffusion length $L_{D,Bulk}$ and in the conducting state, in which the doped zone is swamped by minority charge carriers, have a shortened lifetime $Tau_{Aug}$ by virtue of the Auger recombination, and comprising an axially limited region in the doped zone in which recombination centers for reducing the mean bulk lifetime $Tau_{SRH}$ of the minority charge carriers are present.

2. Discussion of Background

It is known that a reduction in the charge carrier lifetime leads to an improvement in the switching time of a power semiconductor component. A setting of the charge carrier lifetime in a semiconductor component can be achieved with this aim in mind by indiffusion of foreign atoms (e.g. Au or Pt) on the one hand, and by irradiation with protons or electrons, on the other hand. Both the indiffusion of foreign atoms and electron irradiation lead to a relatively homogeneous reduction in lifetime over the entire component. By contrast with the diffusion methods, electron irradiation can, however, be sufficiently well reproduced.

With proton irradiation, a pulse-shaped concentration profile of recombination centers is produced along the current-conducting axis (axial direction). Moreover, the efficiency of the recombination centers can be increased by suitable heat treatment after the irradiation so strongly that overall this method has clear advantages by comparison with Au diffusion (see e.g. "Protonenbestrahlung von Silizium" ("Proton Irradiation of Silicon"), M. W. Hüppi, Diss. ETH No. 8755, pp. 100–110, 1989).

All methods for setting the charge carrier lifetime are inherently subject to the disadvantage that although shorter switching times are achieved by reduction of the charge carrier lifetime, it is necessary to accept in return a higher forward voltage drop (a dissipation in the conducting state). It is known (see e.g. "Shorter Turn-off Times in Insulated Gate Transistors by Proton Implantation", A. Mogro-Campero et al., IEEE Electron Device Letters, Vol. EDL-6, No. 5, May 1985), that with regard to optimizing this trade-off proton irradiation is superior to electron irradiation. This can be explained in terms of the fact that in the case of proton irradiation for setting the lifetime, the degree of freedom in the axial direction of the component (axial lifetime structure) is additionally employed. That is to say, the charge carrier lifetime is reduced only where it is necessary and sensible.

SUMMARY OF THE INVENTION

Accordingly, one object of this invention is to provide a novel semiconductor component of the type specified at the beginning, in which the trade-off between forward voltage drop and turn-off time is improved overall by comparison with the prior art.

It is likewise an object of the invention to specify a method of producing a component according to the invention.

According to the invention, the solution consists in that in the case of a semiconductor component of the named type the recombination centers form a trap density profile varying periodically transverse to the axial direction, in which segments of low trap density alternate with segments of high trap density with a period corresponding approximately to the bulk diffusion length $L_{D,Bulk}$.

A method for producing a semiconductor component having a region limited in the axial direction, in which recombination centers form a trap density profile varying periodically transverse to the axial direction, in which method the semiconductor component is irradiated in the axial direction with protons so that radiation defects are produced in the given limited region, is typified in that the irradiation is done through a gridded aperture, which has proton-transparent and proton-opaque regions corresponding to the trap density profile to be generated.

According to a preferred embodiment, the recombination centers form a two-dimensionally periodically varying trap density profile.

It is likewise in accordance with a preferred embodiment if in segments of low trap density and in segments of high trap density the trap density profile respectively approximately assumes a constantly low or constantly high value, and if the change from segments of low trap density to segments of high trap density takes place abruptly.

With regard to efficiency, the trap density profile is preferably composed area-wise of segments, approximately of the same size, of low and high density.

If the invention is to improve the switching characteristics of a p-n junction, in the axial direction the doped zone adjoins a highly doped zone that injects minority charge carriers and forms with said zone a rapidly switching p-n junction.

In the case of a method according to the invention, use is preferably made of an aperture provided with a hole grid and made from a material such as, e.g. a heavy metal, that strongly absorbs protons.

Further advantageous embodiments of the invention follow from the patent claim.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

The designations used in the drawing are collected in tabular fashion together with their meanings in the list of designations. In principle, the same parts are provided with the same designations.

DESCRIPTION OF THE PREFERRED EMBODIMENTS

In order not to complicate the description unnecessarily, the invention is explained firstly by the example of a diode.

Figure 1:
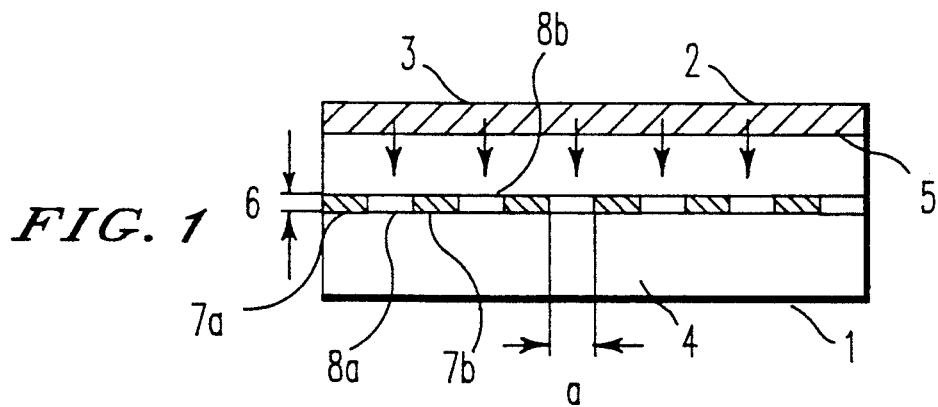
FIG. 1 shows a schematic representation of a semiconductor component with axially and laterally structured trap density profile.

Referring now to the drawings, wherein like reference numerals designate identical or corresponding parts throughout the several views, FIG. 1 shows a semiconductor component, in which a trap density profile according to the invention has been introduced into the semiconductor body for the purpose of shortening the turn-off time.

A semiconductor substrate 1 has in its interior a diffusion profile corresponding to a diode. A highly doped zone 2 penetrates from a first principal surface 3 up to a predetermined depth into the semiconductor substrate 1, and forms with a low-doped zone 4, which is formed by the basic doping of the semiconductor substrate 1, a p-n junction 5. In the conducting state of the semiconductor component, the highly doped zone 2 injects minority charge carriers in an axial direction (perpendicular to the plane p-n junction 5) into the low-doped zone 4. This is indicated in FIG. 1 by arrows.

The low-doped zone 4 has an axially limited region 6, located at a suitable depth, in which recombination centers for reducing the charge carrier lifetime are planted. The recombination centers form a trap density profile which varies periodically transverse to the current-conducting axis (that is to say in a plane perpendicular to the axial direction). Thus, segments of high trap density $7a$, $7b$, ... and segments of low trap density $8a$, $8b$, ... alternate mutually. The segments of low trap density extend perpendicular to the axial direction over a predetermined characteristic length a.

Figure 2:
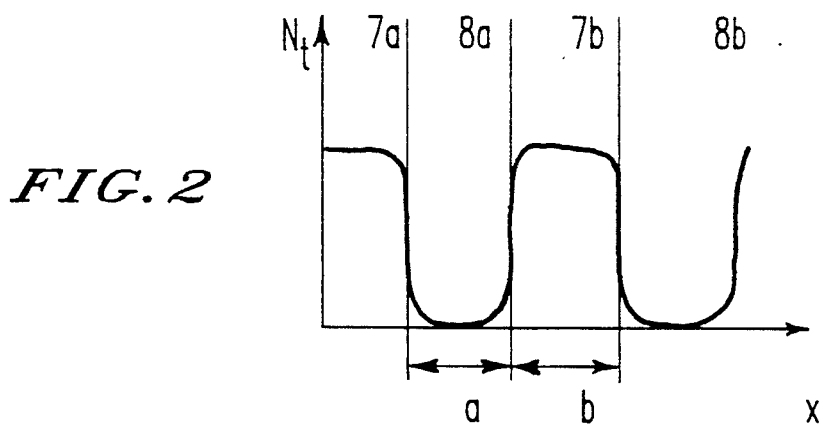
FIG. 2 shows a schematic representation of the trap density profile transverse to the current-conducting axis.

FIG. 2 shows a representation of a trap density profile 9. Plotted on the abscissa is the location x transverse to the current-conducting axis, and on the ordinate the trap density $N_t$. The trap density profile 9 varies periodically. The segments of low trap density extend over a well defined length a.

It will now be explained below how this length a is to be dimensioned.

When the semiconductor component is in a non-conducting state (an in thermal equilibrium), the minority charge carriers in the low-doped zone 4 (with the exception of the axially limited region 6) have a bulk lifetime $Tau_{SRH}$, which is essentially determined by the charge carrier capture at deep impurities, and can be determined with the known Shockley-Read-Hall model. This bulk lifetime $Tau_{SRH}$ is normally assigned a bulk diffusion length $L_{D,Bulk}$ in accordance with $$L_{D,Bulk,i} = \sqrt{D_i Tau_{SRH,i}}.$$

$i = n$ (electron), $p$ (hole) type of the minority charge carrier $D_i$ = diffusion constant.

In visual terms, the bulk diffusion length is the path covered by a minority charge carrier on average until it recombines with a majority charge carrier in a recombination center ("trap").

If the semiconductor component is in a conducting state, the low-doped zone 4 is swamped by minority charge carriers. Given a sufficiently high injection of charge carriers, in addition to the so-called Shockley-Read-Hall mechanism described above, there then also takes place a carrier/carrier recombination, also known as Auger recombination. At high current densities (charge carrier excess in excess of approximately $10^{17}$ cm$^{-3}$), Auger recombination dominates, so that the lifetime is additionally shortened to the Auger lifetime $Tau_{Aug}$. If the semiconductor component is in the conducting state, the Auger lifetime $Tau_{Aug}$ is substantially shorter, as a rule, than the bulk lifetime $Tau_{SRH}$.

If, now, in accordance with the invention, the characteristic length a of the segment of low trap density is chosen such that it corresponds approximately to the bulk diffusion length $L_{D,bulk}$, this produces the following effect:

In the conducting state, the diffusion length of the minority charge carriers is substantially smaller, (because of the short Auger lifetime) than the spacing of the segments of higher trap density. Consequently, the minority charge carriers diffuse largely undisturbed through the axially limited region 4. The inserted recombination centers cause no additional forward voltage drop.

Upon transition of the semiconductor component into the non-conducting state, the diffusion length gradually increases, so that the minority charge carriers are increasingly more strongly captured by the segments of high trap density. In the tail region of the turn-off process, i.e. when the excess charge carrier density is again reduced exclusively via the Shockley-Read-Hall mechanism, the diffusion length of the minority charge carriers essentially corresponds to the bulk diffusion length $L_{D,Bulk}$. The built-in recombination centers can thus develop the lifetime-reducing effect in the interests of a conventional axial lifetime profile.

Stated briefly, the additional lateral structure according to the invention of the trap density profile leads to the fact that the effect of the recombination centers becomes significant only at low current densities. As a result of this, in the case of this method of setting lifetime the forward voltage drop is less by comparison with a conventional axial lifetime profile, without the turn-off characteristic being correspondingly worsened. The trade-off discussed at the beginning between forward voltage drop and turn-off time thus becomes better overall.

It will now be explained below how the trap density profile can be advantageously constructed. Once again, reference is made in this connection to FIGS. 1 and 2.

As has already been said, the trap density profile varies periodically in a plane perpendicular to the current-conducting axis. The trap density profile can vary, then, either only in one direction (in one dimension), in that, e.g. it is constructed in the manner of a strip pattern, or also in two directions (in two dimensions). For the two-dimensional case, there is a plurality of suitable embodiments. Only a few of them are mentioned below.

A first variant consists in that the trap density profile is constructed in the manner of a chessboard pattern. The segments of low, and those of high trap density are essentially square, here, and of the same size.

In a second variant, the trap density profile is constructed in the manner of a dot grid. The segments of high trap density are circles, which are arranged at the lattice points of an imaginary, rectangular, square or rhomboid lattice. The characteristic length a, discussed in detail further above, here corresponds essentially to the spacing of two neighboring lattice points.

With regard to the efficiency of the laterally structured trap density profile, it is advantageous if the segments of low trap density $7a, 7b \ldots$ and the segments of high trap density $8a, 8b$, are approximately of the same size in terms of area.

In accordance with an especially preferred embodiment of the invention, change in the trap density profile 9 takes place abruptly from segments of low trap density $7a, 7b, \ldots$ to sections of high trap density $8a, 8b, \ldots$ In the sections of low and in those of high trap density, the approximately constantly low or high value.

The parameter which is likewise determinative in all embodiments is the bulk diffusion length LD,Bulk. For a lifetime of e.g. $Tau_{SRH}=70$ μs, this is approximately 300 μm at room temperature in n-type silicon and approximately 500 μm in p-type silicon. Consequently, the trap density profile ought to have a period of typically a few 100 μm.

What was said previously in conjunction with the simple component of FIG. 1, can be transferred without difficulty to complicated semiconductor components with axial current conduction, such as transistors and thyristors of the most varied type. Thus, the invention covers a wide range of application. In particular, it can be used wherever conventional axial lifetime profiles are applied.

A preferred method of producing a semiconductor component according to the invention is described below.

The starting point is a completely diffused and oxidized semiconductor substrate 1, which has one or a plurality of p-n structures in its interior. The first step is now to irradiate the semiconductor substrate 1 with high-energy protons, so that recombination centers are produced in a well defined, axially limited region 6. In order that in this process a trap density profile according to the invention is produced, the irradiation is preferably carried out as follows.

Figure 3:
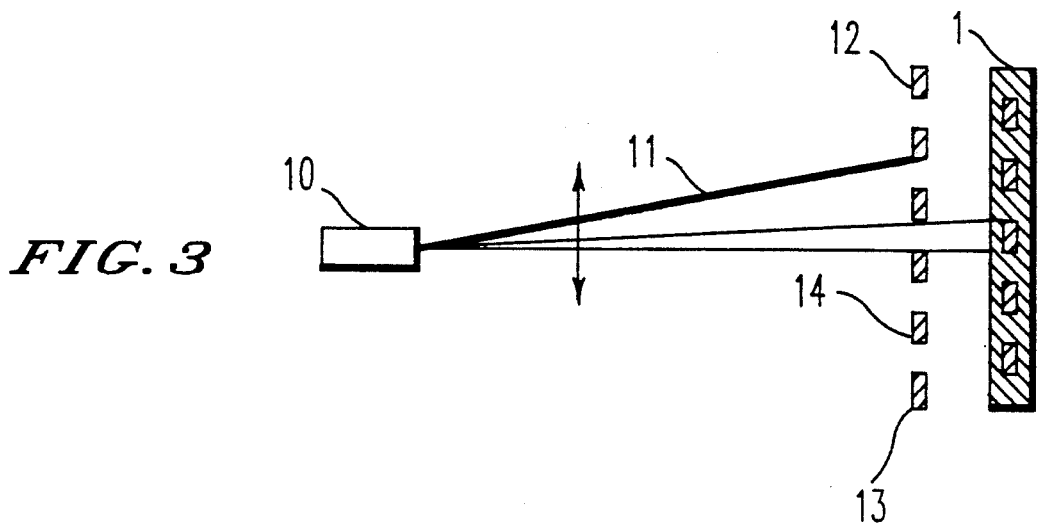
FIG. 3 a device for producing a laterally and axially structured trap density profile in a semiconductor component.

FIG. 3 shows a device for producing an axially and laterally structured trap density profile. An accelerator 10 produces a high-energy proton beam 11, which can be deflected in directions transverse to the proton beam 11, e.g. with a deflecting device (scanner) arranged at the output of the accelerator 10. (In FIG. 3, a double arrow indicates at least one of the two possible directions.) The semiconductor substrate 1 to be irradiated is arranged in an irradiation plane behind an aperture 12 constructed according to the invention. With the aid of the deflecting device, the proton beam 11 is conducted successively in such a fashion over the aperture 12 and the semiconductor substrate 1 partially visible through the aperture 12 that an area-wise irradiation results.

The aperture 12 is at least regionally gridded, i.e. it has a periodic pattern of proton-transparent and proton-opaque regions 13 and 14, respectively. Through the proton-transparent regions 13, the proton beam 11 induces recombination centers in the semiconductor substrate 1 at a desired depth determined by means of the proton energy. In this regard, the concentration of the induced impurities depends in a known fashion from the proton dose.

Figure 4:
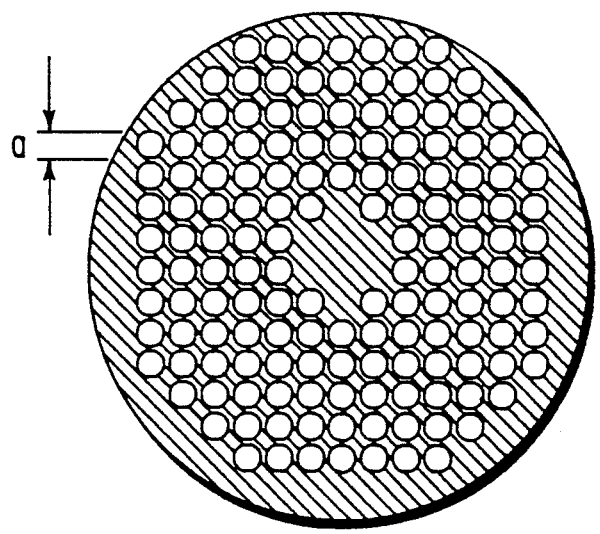
FIG. 4 shows an aperture with a periodic hole grid.

FIG. 4 shows a top view of an aperture 12 having an essentially two-dimensional periodic hole grid. Here, circular bores arranged on a square lattice are provided in a proton-opaque material. The period of the hole grid (characteristic length a) essentially corresponds to the bulk diffusion length $L_{D,Bulk}$ of the low-doped zone 4 to be irradiated in the semiconductor substrate 1. The diameter of the bores is preferably chosen such that proton-transparent and proton-opaque regions are counterbalanced in terms of area.

As may be seen from FIG. 4, area-wise the hole grid need not fill up the entire aperture 12. This is the case, e.g. if the lifetime of the charge carriers is to be reduced only in a laterally well limited region. Thus, in the present example a central region is exempt from irradiation. Whether the semiconductor substrate is irradiated over its entire area or only in a laterally limited region depends basically on the type (inner structure) of the semiconductor component implemented.

Figure 5:
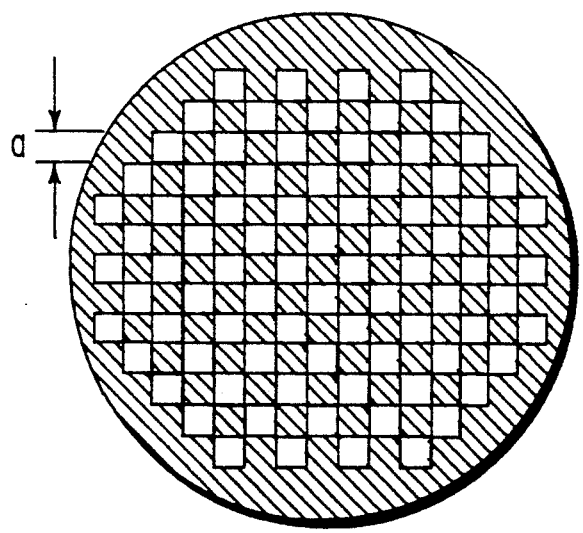
FIG. 5 shows an aperture with a chessboard-like hole grid.

FIG. 5 shows an aperture with a chessboard-like hole grid. In this case, the proton-transparent and the proton-opaque regions are square and have a side length which corresponds to the characteristic length a discussed above.

The aperture is preferably a thin disk, which consists of a heavy metal, e.g. molybdenum, and is provided with bores in the fashion described. The advantage of a heavy metal resides primarily in the fact that even in the case of higher proton energies of, e.g. several MeV, the disk can be kept so thin that the lateral spread of the proton beam at the edges of the aperture, ("shadows", "apparitions") can be kept within narrow limits. This is particularly important if a stepped trap density profile is to be produced. In addition, fine structures can be realized mechanically on thin disks in a simple fashion.

As long as the aperture 12 is formed by a disk of a proton-opaque material and which is penetrated by bores, the only possible patterns are naturally those in which the proton-opaque regions produce a continuous area. If, however, the aperture 12 encompasses a proton-transparent carrier, this limitation can be circumvented.

Figure 6:
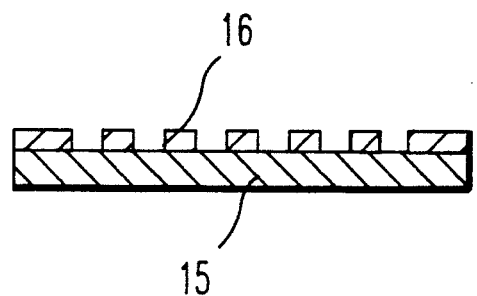
FIG. 6 shows an aperture in the case of which a pattern with proton-absorbing material is arranged on a proton-transparent carrier.

FIG. 6 shows an aperture in the case of which a pattern with proton-absorbing material 16 is arranged on a carrier 15 (e.g. a thin foil made from a light metal) which is effectively proton-transparent. In this way, it is also possible to realize a pattern which is inverse to those shown in FIGS. 4 and 5.

In principle, the pattern shown can be varied in many ways without the effect according to the invention being lost. Thus, the lattice on which the hole grid is based can also be rectangular or rhomboid. However, instead of a hole grid, it is also possible to use a strip pattern. No matter how the pattern is constructed, it is typified in any case by the characteristic length a or $L_{D,Bulk}$.

As a rule, irradiation is further followed by several process steps up to the completion of the semiconductor component. It is especially advantageous to subject the irradiated semiconductor substrate 1 to heat treatment, in order to ensure the long-term stability of the recombination centers. For this purpose, it is held in a high vacuum, i.e. at a pressure of less than approximately $10^{-5}$ torr, for at least 30 minutes at a temperature between 260° C. and 300° C. The exact duration of the heat treatment follows from the irradiation dose selected and from the desired charge carrier lifetime.

Finally, after heat treatment, the semiconductor substrate 1 is subjected to a passivation process known per se, in which one or a plurality of passivation layers are applied and baked. It is to be noted in this connection that the temperatures used for baking are lower than those of the heat treatment, so that the charge carrier lifetime is not altered once again.

It is especially advantageous to carry out the irradiation after the passivation process. To be precise, apart from the obligatory heat treatment process for thermal stabilization of the recombination centers, no further hot processes then follow.

A further possibility of application of the invention is a method in which electrically inactive foreign atoms diffused into the semiconductor substrate are activated selectively as recombination centers by proton irradiation and heat treatment. Such a preferred method is described below.

Diffused into a semiconductor substrate having a desired doping structure (one or a plurality of p-n junctions) are foreign atoms which have the following recombination and diffusion characteristics:

1. Active as to recombination on a lattice site;
2. Inactive as to recombination on an interstitial site;
3. Diffusion is done interstitially and via a vacancy mechanism (i.e. disassociatively), but essentially not via a kick-out mechanism.

Energy considerations can be used to determine which characteristics a given foreign atom has in a specific semiconductor crystal.

Foreign atoms with these characteristics in a silicon crystal are. e.g. Cu, Ag or Pd atoms. By comparison with Cu, Ag has the advantage that it has only a slight tendency towards complex formation. The method is explained below with reference to the example of Ag in Si.

After indiffusion, which produces a concentration profile of interstitial and thus electrically inactive foreign atoms, Ag in the present example, there follows proton irradiation according to the invention, which leads in an axially limited region to a laterally structured vacancy profile. In this case, the vacancy profile must essentially coincide spatially with the concentration profile.

If, now, the semiconductor component is subjected to heat treatment, the process Ag(int)+Vac→Ag(sub) occurs in the defect zone produced by the irradiation, i.e. the interstitial Ag diffuses onto the vacancies and becomes electrically active. The vacancy profile produced by the irradiation is converted into a concentration profile of substitutional Ag.

By contrast with the vacancies, such as are produced in the case of the use of irradiation alone, with reference to recombination substitutional Ag is more effective by a factor of approximately 10.

It may be said in conclusion that by means of the axial and lateral lifetime structuring according to the invention it is possible substantially to improve the trade-off between forward voltage drop and turn-off time in the case of a large number of semiconductor components of high power.

Obviously, numerous modifications and variations of the present invention are possible in light of the above teachings. It is therefore to be understood that within the scope of the appended claims, the invention may be practiced otherwise than as specifically described herein.

LIST OF DESIGNATIONS

1-Semiconductor substrate; 2-highly doped zone; 3-principal surface; 4-low-doped zone; 5-p-n junction; 6-axially limited region; 7a, 7b-segments of high trap density; 8a, 8b-segments of low trap density; 9-trap density profile; 10-accelerator; 11-proton beam; 12-aperture; 13-proton-transparent region; 14-proton-opaque region; 15-carrier; 16-proton-absorbing material; a-characteristic length; $N_T$-trap density; x-location.

What is claimed as new and desired to be secured by letters patent of the United States is:

1. A semiconductor element having a current direction that can switch from a conducting into a non-conducting state, comprising
    (a) a doped zone having minority charge carriers, which in the non-conducting state have a given mean bulk lifetime $Tau_{SRH}$ and thus a mean bulk diffusion length $LD_{,Bulk}$ and in the conducting state, in which the doped zone is swamped by minority charge carriers in an axial direction parallel to the current direction, having a shortened lifetime $Tau_{Aug}$ by virtue of the Auger recombination, and
    (b) a region limited in said axial direction, located at a given depth in the doped zone, in which region there is a pulse shaped concentration profile of recombination centers for reducing the mean bulk lifetime $Tau_{SRH}$ of the minority charge carriers; said axially limited region having a length in the axial direction which is smaller or equal to the length of said doped zone; wherein
    (c) the recombination centers form a trap density profile varying periodically transverse to said axial direction, in which segments of low trap density alternate with segments of high trap density with a period corresponding approximately to the bulk diffusion length $L_{D.Bulk}$.

2. The semiconductor component as claimed in claim 1, wherein transverse to said axial direction the recombination centers form a two-dimensionally periodically varying trap density profile.

3. The semiconductor component as claimed in claim 1, wherein
    (a) in segments of low trap density and in segments of high trap density the trap density profile respectively approximately assumes a constantly low or constantly high value, and
    (b) the change from segments of low trap density to segments of high trap density takes place abruptly.

4. The semiconductor component as claimed in claim 3, wherein the segments of low trap density and the segments of high trap density are approximately of the same size in terms of area.

5. A semiconductor element having a current direction that can switch from a conducting into a non-conducting state, comprising
    (a) a doped zone having minority charge carriers, which in the non-conducting state have a given mean bulk lifetime $Tau_{SRH}$ and thus a mean bulk diffusion length $LD_{,Bulk}$ and in the conducting state, in which the doped zone is swamped by minority charge carriers in an axial direction parallel to the current direction, having a shortened lifetime $Tau_{Aug}$ by virtue of the Auger recombination, and (b) a region limited in said axial direction, located at a given depth in the doped zone, in which region there is a pulse shaped concentration profile of recombination centers for reducing the mean bulk lifetime $\text{Tau}_{SRH}$ of the minority charge carriers; said axially limited region having a length in the axial direction which is smaller or equal to the length of said doped zone; wherein (c) the recombination centers form a trap density profile varying periodically transverse to said axial direction, in which segments of low trap density alternate with segments of high trap density with a period corresponding approximately to the bulk diffusion length $L_{D,Bulk}$, and (d) in said axial direction the doped zone adjoins a highly doped zone that injects minority charge carriers, and forms with said zone a rapidly switching p-n junction.

* * * * *